United States Patent
Wang et al.

(10) Patent No.: US 9,482,952 B2
(45) Date of Patent: Nov. 1, 2016

(54) COMPOSITION FOR FORMING TOPCOAT LAYER AND RESIST PATTERN FORMATION METHOD EMPLOYING THE SAME

(71) Applicant: AZ ELECTRONIC MATERIALS (LUXEMBOURG) S.A.R.L., Somerville, NJ (US)

(72) Inventors: Xiaowei Wang, Shizouka (JP); Tetsuo Okayasu, Shizuoka (JP); Georg Pawlowski, Shizuoka (JP); Takafumi Kinuta, Shizuoka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/773,047

(22) PCT Filed: Mar. 14, 2014

(86) PCT No.: PCT/JP2014/056858
§ 371 (c)(1),
(2) Date: Sep. 4, 2015

(87) PCT Pub. No.: WO2014/142296
PCT Pub. Date: Sep. 18, 2014

(65) Prior Publication Data
US 2016/0011510 A1  Jan. 14, 2016

(30) Foreign Application Priority Data

Mar. 15, 2013 (JP) ................. 2013-053401

(51) Int. Cl.
| | |
|---|---|
| *G03F 7/09* | (2006.01) |
| *G03F 7/11* | (2006.01) |
| *G03F 7/20* | (2006.01) |
| *G03F 7/32* | (2006.01) |
| *C08G 63/133* | (2006.01) |
| *C08F 20/10* | (2006.01) |
| *C09D 4/00* | (2006.01) |

(52) U.S. Cl.
CPC ............. *G03F 7/091* (2013.01); *C08F 20/10* (2013.01); *C08G 63/133* (2013.01); *C09D 4/00* (2013.01); *G03F 7/11* (2013.01); *G03F 7/20* (2013.01); *G03F 7/322* (2013.01)

(58) Field of Classification Search
None
See application file for complete search history.

(56) References Cited

U.S. PATENT DOCUMENTS

| | | | |
|---|---|---|---|
| 6,503,688 B1 | 1/2003 | Preece et al. | |
| 2005/0008864 A1 | 1/2005 | Ingen Schenau et al. | |
| 2007/0298328 A1 | 12/2007 | Palmer et al. | |
| 2009/0280416 A1* | 11/2009 | Einaga | G03F 7/0007 430/7 |
| 2012/0021555 A1 | 1/2012 | Tu et al. | |
| 2013/0089820 A1 | 4/2013 | Hatakeyama et al. | |
| 2013/0143162 A1 | 6/2013 | Hatakeyama et al. | |
| 2013/0209940 A1 | 8/2013 | Sakamoto et al. | |

FOREIGN PATENT DOCUMENTS

| | | |
|---|---|---|
| JP | 2002-532759 A | 10/2002 |
| JP | 2004-348133 A | 12/2004 |
| JP | 2008-513821 A | 5/2008 |
| JP | 2010-175858 A | 8/2010 |
| JP | 2013-83821 A | 5/2013 |
| JP | 2013-120194 A | 6/2013 |
| WO | WO 2012/053302 A1 | 4/2012 |

OTHER PUBLICATIONS

Ka et al (Chemical Abstract 2010:1508735—English abstract for KR 997544).*

* cited by examiner

*Primary Examiner* — Sin Lee
(74) *Attorney, Agent, or Firm* — Mitchell Brustein

(57) ABSTRACT

To provide a composition for forming a topcoat layer enabling to produce a pattern excellent in roughness and in pattern shape, and also to provide a pattern formation method employing that.

A composition for forming a topcoat layer, containing a solvent and a triphenylene derivative having a hydrophilic group; and also a method of forming a pattern by casting the above composition on a resist surface and then by subjecting it to exposure and development. The composition may further contain a polymer.

10 Claims, No Drawings

COMPOSITION FOR FORMING TOPCOAT LAYER AND RESIST PATTERN FORMATION METHOD EMPLOYING THE SAME

This application is a United States National Stage Patent Application under 35 U.S.C. §371 of International Patent Application No. PCT/JP2014/056858, filed Mar. 14, 2014, which claims priority to Japanese Patent Application No. 2013-053401, filed Mar. 15, 2013, the contents of which are being hereby incorporated herein by reference.

TECHNICAL FIELD

The present invention relates to a composition for forming a topcoat layer used in a photolithographic process. In detail, this invention relates to a composition for forming a topcoat layer that is provided on a resist layer before the resist layer is exposed to extreme UV light for producing a resist pattern in a photolithographic process. Further, the invention also relates to a pattern formation method using that composition for forming a topcoat layer.

BACKGROUND ART

According to a recent trend toward downsizing of various devices, there have been strong demands for high integration of semiconductor ICs and hence resist patterns have been required to be made more and more minute so as to meet the demands. In order to satisfy this requirement, it is necessary to adopt a photolithographic process including exposure to light in a shorter wavelength range. The light for exposure has thus become shorter and shorter in wavelength, and has changed from visible light to UV or far UV light. Further, the exposure is now often carried out by use of extreme UV light. For example, in manufacture of semiconductor devices such as ICs and LSIs, specifically, in production processes of DRAMs, flash memories and logic semiconductor devices, it is required to form ultrafine patterns and hence lithography with extreme UV light is becoming more and more important.

To cope with the above requirement, researchers have developed many resist compositions sensitive to light in various wavelength ranges. Among them, commercially available chemically amplified resist compositions have been hitherto thought to be mostly employable in a photo-lithographic process with extreme UV light. For example, common resist compositions for KF or ArF laser exposure have been regarded as also usable in a lithographic process including exposure to extreme UV light. Actually, however, there remain many problems needed to improve in view of resolution, sensitivity, roughness, and so on.

On the other hand, there also remain problems of light sources and masks in exposure apparatuses, and those problems are reasons why lithography technique with extreme UV light has not yet been widely employed in practice. It has been thought that resist pattern shapes are impaired by longer wavelength light, particularly, deep UV light of, for example, 193 nm or 248 nm, contained in emission from extreme UV light sources. When resist compositions for KF or ArF laser exposure are used as described above in a lithographic process with extreme UV light, they are sensitively made to react not only by extreme UV light but also, of course, by deep UV light in a longer wavelength range than extreme UV light.

Extreme UV light sources generally emit extreme UV light together with longer wavelength light, such as deep UV light. Accordingly, when a fine pattern is intended to be formed according to a lithographic process by use of extreme UV light, it is preferred to adopt a light source less emitting the longer wavelength light. In order to remove deep UV light from radiation emitted by exposure apparatuses, the way of generating extreme UV light is commonly controlled. For example, optical systems in the apparatuses are regulated so as to remove deep UV light from emission of light sources. It is, however, very difficult to remove deep UV light completely from emission of conventional light sources, and hence it has been impossible in conventional exposure apparatuses to reduce the ratio of deep UV light down to 3% or less in exposure light. Since deep UV light thus contained in emission from extreme UV light sources causes impairment of resist patterns in view of roughness and pattern shape, it has been desired to improve this problem.

Meanwhile, the exposure to extreme UV light is generally carried out under high vacuum conditions. Accordingly, when a resist layer is subjected to the exposure in a lithographic process, it often gives off gases of volatile substances, which are low molecular weight compounds formed by photochemical reactions and/or components of the resist composition contained in the resist layer, such as, photo-sensitive materials and photo acid-generating agents. Those gases are referred to as "outgases", and they often stain photo-masks and/or optical elements such as mirrors in exposure apparatuses to degrade the exposure accuracy. Accordingly, it has been also desired to prevent the resist layer from releasing gases.

As a means for solving the above problems, a method is developed in which the top surface of a resist layer is coated with a topcoat layer which transmits extreme UV light but absorbs deep UV light and also which prevents the resist layer from giving off gases (Patent documents 1 and 2). Further, researches have been made on polymers that absorb deep UV light enough to be usable, for the topcoat layer (Patent document 3). Those polymers have benzene, naphthalene or anthracene skeletons so as to improve the effect of the topcoat layer on absorbing deep UV light. For the purpose of further enhancing the absorption of deep UV light, studies have been made on searching for suitable polymers and/or favorable combinations of polymers.

PRIOR ART DOCUMENTS

[Patent document 1] Japanese Patent Laid-Open No. 2004-348133
[Patent document 2] U.S. Patent Publication No. 2012/21555
[Patent document 3] International Patent Publication No. 2012/053302

DISCLOSURE OF INVENTION

Problem to be Solved by the Invention

However, it has been desired to provide a topcoat layer having higher effect of absorbing deep UV light than the conventionally proposed topcoat layers.

Means for Solving Problem

The present invention resides in a composition for forming a topcoat layer, containing a solvent and a triphenylene derivative having a hydrophilic group.

The present invention also resides in a pattern formation method comprising the steps of:
casting a resist composition on a substrate, to form a resist layer,
coating the resist layer with the above composition for forming a topcoat layer,
heating to harden the composition on the resist layer,
subjecting the resist layer to exposure by use of extreme UV light, and
developing the exposed resist layer with an alkali aqueous solution.

Effect of the Invention

The present invention enables to form a topcoat layer which can reduce unfavorable effects of deep UV light to protect a resist pattern from impairment in roughness and in pattern shape and also which can prevent a resist layer from releasing gases in a photolithographic process for pattern formation including exposure to extreme UV light. That topcoat layer absorbs deep UV light enough to achieve a deep UV light absorptivity of 85% or more. Further, the pattern formation method of the present invention makes it possible to produce a minute pattern accurately without staining the exposure apparatus with gases given off from the resist layer. Furthermore, the composition of the present invention for forming a topcoat layer reduces residues remaining after development on the surface of a resist pattern and accordingly, also in view of that, can contribute to excellent pattern formation.

BEST MODE FOR CARRYING OUT THE INVENTION

Embodiments of the present invention are described below in detail.

The composition according to the present invention is used for forming a topcoat layer on the top surface of a resist layer. This composition contains a triphenylene derivative, and can form a topcoat layer absorbing light (hereinafter, often referred to as "deep UV light") in the wavelength range of 170 to 300 nm, mainly at 193 nm and 248 nm.

Triphenylene is a compound whose structure comprises four condensed aromatic rings, and has strong absorption in the deep UV range, particularly, at the wavelength of 248 nm. The absorption of deep UV light is attributed to the triphenylene skeleton, and hence various triphenylene derivatives exhibit similar light absorption profiles.

Among them, a triphenylene compound consisting of only carbon atoms and hydrogen atoms without any substituent groups is very insoluble in alkali solutions. Accordingly, if containing it, the composition for forming a topcoat layer is difficult to be dissolved and removed away from the resist surface in the developing procedure. Further, that triphenylene compound has low polarity and poor affinity to the resist surface, and furthermore molecules thereof scarcely interact with each other, and hence it is difficult to form a coat covering the resist surface. There are, therefore, too many problems to adopt the non-substituted triphenylene in the composition for forming a topcoat layer. The present invention solves those problems by use of triphenylene derivatives.

Specifically, the present invention employs a triphenylene derivative derived from the triphenylene by introducing substituent groups, and thereby improves the solubility to an alkali aqueous solution so that the composition can be easily removed away in the developing procedure and further so that the affinity to the surface and the interaction among the molecules can be enhanced. Thus, the present invention has succeeded in improving film-formability and coverability of the topcoat layer.

The substituent groups are preferably hydrophilic groups. Preferred examples of them include hydroxyl group, carboxyl group, sulfo group, amino group, amido group, nitro group, cyano group, and polyalkyleneoxide group. Here, the hydroxyl group includes phenolic hydroxyl group. The above substituent groups improve hydrophilicity of the triphenylene derivatives, and accordingly improve both of the solubility to alkali aqueous solutions and the film-formability. It is necessary in general for the derivative to have three or more substituent groups in one triphenylene skeleton. However, the more substituent groups the triphenylene derivative has, the more the effect of the present invention tends to appear. It is, therefore, preferred for the derivative to have four or more substituent groups in one triphenylene skeleton so as to ensure sufficient solubility to an alkali developer, such as, a 2.38% aqueous solution of tetramethylammonium hydroxide. Further, in view of the film-formability for forming the topcoat layer, the derivative has further preferably six or more substituent groups in one triphenylene skeleton. Various kinds of that triphenylene derivative are known and commercially available.

The hydrophilic group does not need to connect directly to the triphenylene skeleton, and may connect to the skeleton via a linking group such as a hydrocarbon group. In that case, for example, the linking group may be the main chain of a hydrophilic polymer while the triphenylene skeleton may connect to the side chain thereof.

The triphenylene derivative preferably used in the present invention is, for example, represented by the following formula (1):

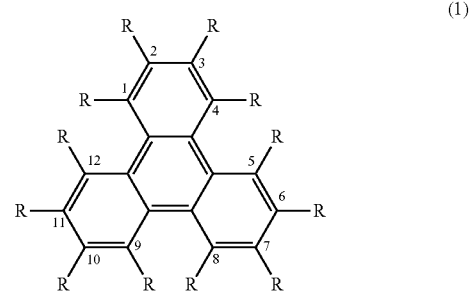

(in which each R is hydrogen or a hydrophilic group provided that at least three of the Rs are the hydrophilic groups). Here, the hydrophilic group can be selected from the group consisting of hydroxyl group, carboxyl group, sulfo group, amino group, amido group, nitro group, cyano group, and polyalkyleneoxide group. Even if some Rs are hydrophobic groups such as hydrocarbon groups, the effect of the present invention may be obtained. However, if containing hydrophobic groups, the derivative has poor solubility in an alkali aqueous solution. Accordingly, it is preferred for the derivative not to contain hydrophobic groups.

There are no particular restrictions on the positions of the hydrophilic groups, but they are preferably located at 2-, 3-, 6-, 7-, 10- and/or 11-positions. Especially in the case where six of the Rs are the hydrophilic groups, it is particularly preferred for the derivative to have them at 2-, 3-, 6-, 7-, 10- and 11-positions. Examples of that derivative include the following compounds:

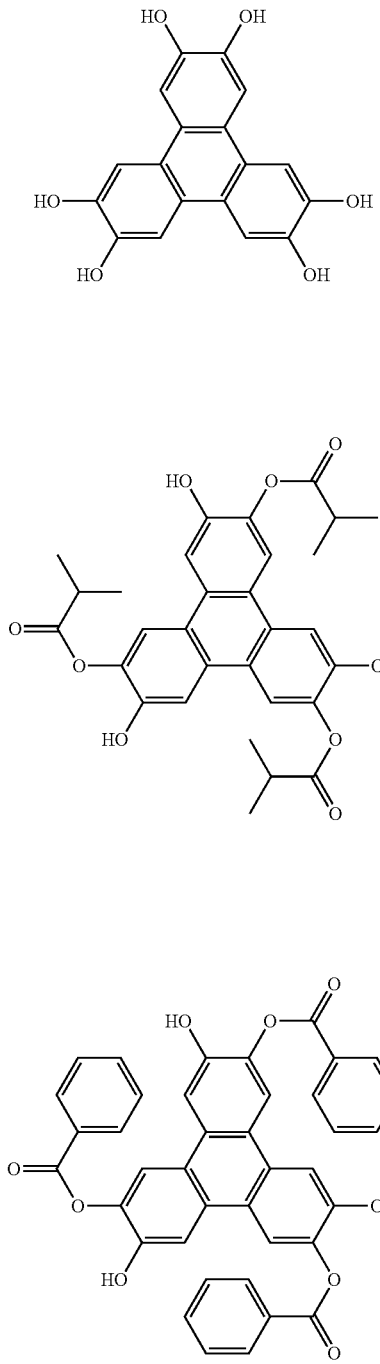

(1-1)

(1-2)

(1-3)

Other examples of the triphenylene derivative preferably used in the present invention include a polymer which comprises a repeating unit containing a triphenylene skeleton. This polymer contains a triphenylene skeleton in the main chain or in the side chain. The polymer serving as the triphenylene derivative contains the hydrophilic groups, which may be included either in the main chain or in the side chain and also which may connect to the triphenylene skeleton contained in the polymer either directly or indirectly via a linking group such as a hydrocarbon group.

The polymer having a triphenylene skeleton is, for example, represented by the following formula (2A) or (2B):

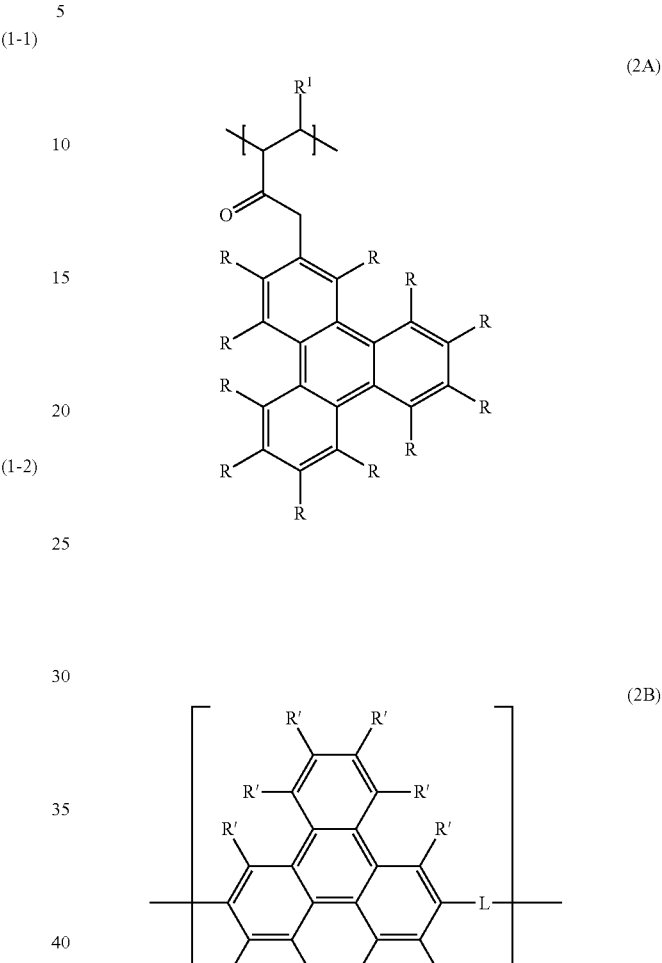

(2A)

(2B)

(in which
each R is hydrogen or a hydrophilic group provided that at least three of the Rs are the hydrophilic groups;
$R^1$ is hydrogen or methyl group;
each R' is hydrogen, a hydrophilic group, or a repeating unit represented by the formula (2B), provided that at least three of the R's are the hydrophilic groups; and
L is a divalent linking group).

The divalent linking group L can be freely selected. Examples of the linking group L include a single bond, alkylene groups, alkyleneoxide groups, alkenylene groups, alkynylene groups, ethylene bond, acetylene bond, ether bond, ester bond, sulfonate ester bond, imide bond, amide bond, azo bond, and sulfide bond.

The polymer comprising the repeating unit (2B) includes a branched polymer or dendrimer in which one or some of the R's further connect to the repeating unit (2B). Examples of them include a dendrimer having the following structure:

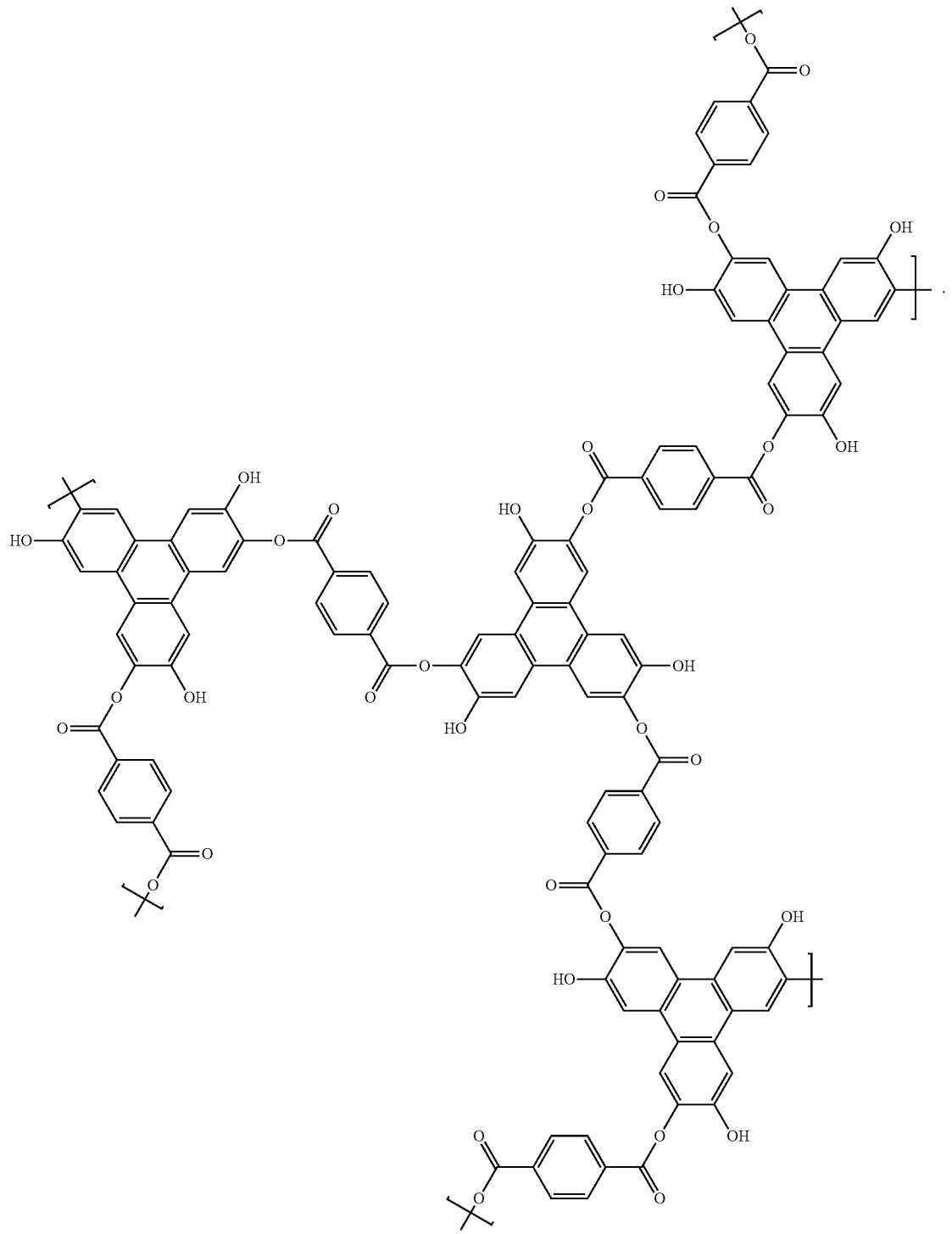

(2B-1)

There are no particular restrictions on the molecular weight of the above polymer having a triphenylene skeleton. However, its weight average molecular weight is preferably 1000 to 20000, more preferably 2000 to 5000 so that the composition for forming a topcoat layer can have favorable coatability.

The content of the triphenylene derivative in the composition for forming a topcoat layer is controlled according to the optical and gas-barrier characteristics required of the aimed topcoat layer, but is preferably 0.01 to 10 wt %, more preferably 0.5 to 5 wt %, based on the total weight of the composition. It should be noted that the triphenylene derivative in the present invention functions as a film-forming component by itself rather than as an additive used in combination with a film-forming polymer for the topcoat layer. Accordingly, in the composition for forming a topcoat layer, all the solid contents may be attributed to the triphenylene derivative.

The composition of the present invention for forming a topcoat layer contains a solvent, which can dissolve the above triphenylene derivative and, if necessary, polymers and additives. Examples of the solvent include:
(a) mono-alcohols, such as, methyl alcohol, ethyl alcohol, isopropyl alcohol, and methyl isobutyl carbinol;
(b) polyols, such as, ethylene glycol and glycerol;
(c) alkyl ethers of polyols, such as, ethylene glycol monomethyl ether, ethylene glycol monoethyl ether and propylene glycol monomethyl ether;
(d) alkyl ether acetates of polyols, such as, ethylene glycol monomethyl ether acetate and ethylene glycol monoethyl ether acetate;
(e) ethers, such as, diethyl ether and dibutyl ether;
(f) cyclic ethers, such as, tetrahydrofuran;
(g) hydrocarbons having 12 or less carbon atoms, such as, n-hexane, n-octane, and cyclohexane;
(h) aromatic hydrocarbons, such as, benzene and toluene;
(i) ketones, such as, acetone and methyl ethyl ketone;
(j) esters, such as, methyl acetate, ethyl acetate, and ethyl lactate; and
(k) water.
There are some organic solvents highly dissolving resist patterns. If those solvents need to be used, it is preferred to adopt mixed solvents of them with solvents having low solvency to resist patterns, for example, with water.

In the present invention, the composition for forming a topcoat layer may comprise only the triphenylene derivative and the solvent, but may further contain a polymer as a film-forming component. Hereinafter, this polymer is often referred to as "binder polymer" or simply "binder". Accordingly, the "binder" here means a polymer not having a triphenylene skeleton. Since the triphenylene derivative has a hydrophilic group, the composition of the present invention for forming a topcoat layer is characterized by being capable of forming a film even if the triphenylene derivative in itself is not a polymer or even if the composition does not contain a binder as a film-forming component. If the composition containing no binder is used to form a topcoat layer, the formed topcoat layer can be easily removed by a developer. That composition is, hence, preferred. Thus, even if the triphenylene derivative in itself is not a polymer or even if the composition does not contain a binder as a film-forming component, the composition can form a topcoat layer. The reason of that is presumed to be because the substituent groups introduced into the triphenylene derivative are chemically adsorbed onto the resist surface and also make molecules of the triphenylene derivative interact to combine with each other.

On the other hand, if the binder is incorporated as a film-forming component into the composition, the film-formability is improved to form a more even topcoat layer. Thus, if containing the binder, the composition can form a relatively strong topcoat layer and hence can prevent the topcoat layer from exfoliation caused by physical contact or the like. Accordingly, it is preferred to use the binder.

If used in combination with the triphenylene derivative, the binder preferably has high compatibility with the derivative. However, the binder is not particularly restricted, and any binder can be used. Although the binder may be a natural polymer compound, a synthetic co-polymer or homo-polymer comprising repeating units is preferably used in view of the production stability. There are no particular restrictions on the polymerization mode of the binder polymer, and in other words, there is no particular restriction on how monomers are polymerized to form the binder polymer. Accordingly, the binder may be formed by any polymerization reaction such as condensation polymerization, ring-opening polymerization or addition polymerization.

Various kinds of the binder are known, and any of them can be selected unless it impairs the effect of the present invention. Examples of the binder include: phenolic resins such as novolac resin, polyhydroxylstyrene, polyvinyl alcohol, polyacrylic acid, polymethacrylic acid, polyacrylic esters, polymethacrylic esters, polyvinyl acetate, and polyvinylpyrrolidone. Examples of the polyacrylic esters and polymethacrylic esters include: hydroxyethyl acrylate, acrylic acid polyethylene oxide adduct, hydroxyethyl methacrylate, and methacrylic acid polyethylene oxide adduct.

The binder preferably comprises a hydrophilic group having effect of making the binder soluble in water. That kind of hydrophilic group is generally well-known, and examples thereof include hydroxyl group, carboxyl group, sulfo group, substituted or unsubstituted amino group, substituted or unsubstituted ammonium group, carboxylic ester group, sulfonic ester group, substituted or unsubstituted amido group, alkyleneoxide group, and oxime group. Among them, hydroxyl group and carboxyl group are preferred. In the case where the above groups have substituent groups, examples of the substituent groups include aliphatic hydrocarbon groups such as alkyl groups and aromatic hydrocarbon groups such as phenyl groups. If the substituent groups are aromatic hydrocarbon groups, they often serve as deep-UV absorbing groups. The topcoat layer according to the present invention is preferably used in a pattern formation process in which development is carried out with an alkali aqueous solution, but is not limited to that. For example, if using a triphenylene derivative having a less amount of hydrophilic groups, the present invention can be applied to a pattern formation process including development with an organic solvent.

In the case where the composition contains the binder, the content thereof is controlled according to the aimed thickness or the like but is generally 0.1 to 10 wt %, preferably 0.5 to 5 wt %, based on the total weight of the composition for forming a topcoat layer. If the composition contains the binder too much, the resultant topcoat layer may be so thick as to absorb a large amount of extreme UV light. That should be paid attention to.

If used in the present invention, the binder may have deep-UV absorbing groups so as to assist the triphenylene derivative in absorbing deep UV light. Here, the term "deep-UV absorbing groups" in the present invention means groups that absorb light in the wavelength range of 170 to 300 nm. Examples thereof include aromatic groups, particularly, phenyl, naphthyl and anthracenyl. Those groups may have substituent groups, if needed. Examples of the substituent groups include hydrocarbon groups such as alkyl groups.

The composition according to the present invention for forming a topcoat layer may further contain other additives, which are intended, for example, for enhancing coatability of the composition onto the resist layer and for improving characteristics of the formed topcoat layer. The additives are, for example, surfactants. Examples of the surfactants include:
(a) anionic surfactants, such as, alkyl diphenyl ether disulfonic acid, alkyl diphenyl ether sulfonic acid, alkyl benzene disulfonic acid, polyoxyethylene alkyl ether sulfonic acid, alkyl sulfonic acid, and ammonium salts and organic amine salts thereof;

(b) cationic surfactants, such as, hexadecyl trimethyl ammonium hydroxide;
(c) nonionic surfactants, such as, polyoxyethylene alkyl ethers (e.g., polyoxyethylene lauryl ether, polyoxyethylene oleyl ether, polyoxyethylene cetyl ether), polyoxyethylene fatty acid diester, polyoxyethylene fatty acid monoester, polyoxyethylene-polyoxypropylene block copolymer, and acetylene glycol derivatives; and
(d) amphoteric surfactants, such as, 2-alkyl-N-carboxymethyl-N-hydroxyethyl imidazolinium betaine, lauric acid amide propyl hydroxyl sulfone betaine.

However, it should be noted that those examples by no means constitute an exhaustive list of surfactants usable in the present invention, Among the above, nonionic surfactants are preferred. On the other hand, since surfactants having amine groups or carboxyl groups may react with the hydrophilic groups connecting to the triphenylene derivative, they should be paid attention to if used. Other additives are, for example, thickening agents, colorants such as dyes, acids and bases. The amount of each additive is determined in consideration of the effect thereof, but is normally 0.01 to 1 wt %, preferably 0.1 to 0.5 wt % based on the total weight of the composition.

The composition according to the present invention for forming a topcoat layer can be used in the same manner as a conventional composition for forming a topcoat layer or for forming a top antireflective coating. This means that it is unnecessary to change the production process drastically when patterns are formed by use of the composition of the present invention. The following describes concretely the pattern formation method employing the composition of the present invention for forming a topcoat layer.

First, a resist composition is cast on the surface, which may be pretreated, if necessary, of a substrate such as a silicon substrate or a glass substrate according to a known coating method such as spin-coating method, to form a resist composition layer. Prior to the coating of the resist composition, an undercoating layer may be beforehand formed under the resist composition layer by coating. The undercoating layer can improve adhesion between the resist layer and the substrate. Further, if containing transition metals or oxides thereof, the undercoating layer can enhance reflected light to improve the exposure margin.

The pattern formation method of the present invention can employ any one selected from known resist compositions sensitive to extreme UV light. At present, it is general to use a resist composition for deep UV exposure, such as, a photoresist composition for ArF or KrF laser exposure. In the pattern formation method according to the present invention, any resist composition can be selected to use without limitation as long as it has sensitivity to extreme UV light. However, particularly preferred are positive- and negative-working chemically amplified resist compositions.

Either positive- or negative-working chemically amplified resist composition can be used in the pattern formation method of the present invention. The chemically amplified resist composition generates an acid when exposed to radiation, and the acid serves as a catalyst to promote chemical reaction by which solubility to a developer is changed within the areas irradiated with the radiation to form a pattern. For example, the chemically amplified resist composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

Subsequently, according to, for example, spin-coating, the resist layer thus formed on the substrate is coated with the composition of the present invention for forming a topcoat layer. The applied composition is then heated to evaporate the solvent and thereby to form a topcoat layer. This heating is carried out by means of, for example, a hot-plate. The temperature of heating is determined according to the solvent of the composition, but is normally 25 to 150° C., preferably 80 to 130° C., further preferably 90 to 110° C. The topcoat layer thus formed has a thickness of normally 1 to 100 nm, preferably 5 to 50 nm.

The resist layer may be heated alone to harden immediately after formed on the substrate, and then the composition for forming a topcoat layer can be cast thereon and heated.

The topcoat layer thus formed is highly transparent to extreme UV light. In general, transparency to extreme UV light hardly depends on the substituent groups of the polymer, but relatively largely depends on the kinds of elements constituting the polymer. Carbon and hydrogen, which are main constituting elements of the topcoat layer, absorb extreme UV light to such a small degree that the topcoat layer can be transparent enough to achieve the effect of the present invention. The topcoat layer has transmittance of preferably 80% or more, further preferably 85% or more to extreme UV light at 13.5 nm. On the other hand, the topcoat layer formed in the above manner is poorly transparent to deep UV light, and hence has transmittance of preferably 20% or less, further preferably 15% or less to deep UV light at 248 nm.

Thereafter, the resist layer is subjected to exposure through a mask according to necessity by use of extreme UV light, for example, in the wavelength range of 5 to 20 nm, particularly, at 13.5 nm.

After the exposure, the resist layer is subjected to after-exposure heating, if necessary, and then developed in the manner of, for example, paddle development, to form a resist pattern. The development is normally carried out by use of an alkali developer. Since the composition of the present invention for forming a topcoat layer contains the triphenylene derivative having a hydrophilic group, the topcoat layer is easily removed by the developer.

The above means that, in the present invention, both removal of the topcoat layer and development of the resist layer can be conducted with an alkali developer at the same time without exceptional procedures. However, the topcoat layer may be alone removed with an aqueous solvent such as water, and then the resist layer can be independently developed with an alkali developer.

Examples of the alkali developer include aqueous solutions of sodium hydroxide and tetramethylammonium hydroxide (TMAH). After the development, the resist pattern is rinsed (washed), if necessary, with a rinse solution, preferably, pure water. The resist pattern thus formed is employed as a resist for etching, plating, ion diffusion or dyeing, and then, if necessary, peeled away.

The thickness of the resist pattern is suitably determined according to the use and the like, but is normally 0.1 to 150 nm, preferably 20 to 80 nm.

The resist pattern thus formed by the pattern formation method of the present invention is then fabricated according to the use. The pattern formation method of the present invention does not particularly restrict the fabrication, and hence the resist pattern can be fabricated in a conventional manner.

If the triphenylene derivative is added into the resist composition, deep-UV light may be absorbed to some degree. However, in that case, the triphenylene derivative is left in the resultant resist layer. Consequently, when the pattern is formed, the triphenylene derivative remains on the top and side surfaces of the resist pattern. As generally known, triphenylene derivatives are hard substances and they are harder than the hardened resist layer. Accordingly, the remaining triphenylene derivative often forms convex bumps on the top and side surfaces of the resist pattern, and further the bumps may come off to form defects in the shape of craters on the surfaces. It is unfavorable for the resist pattern surface to have those convex bumps and/or concave defects. In contrast, the triphenylene derivative in the present invention is not contained in the resist layer and removed in the developing procedure, and hence they do not cause problems.

The present invention is further explained by use of the following Examples.

EXAMPLES 101 to 121

As the triphenylene derivatives, the afore-mentioned compounds (1-1), (1-2), (1-3) and (2B-1) were prepared. With respect to the compound (1-1), a commercial product thereof was employed. The compounds (1-2) and (1-3) were synthesized by making the compound (1-1) react with carboxylic anhydrides. Specifically, the compound (1-1) was dissolved in dimethylformamide, and then triethylamine was added. After the mixture was stirred for 10 minutes, three equivalents of isobutylic anhydride or benzoic anhydride was added and made to react by heating with stirring at 110° C. for 2 hours. The reaction mixture was cooled to room temperature, and then condensed by distilling off the solvent to reduce by half under reduced pressure. Thereafter, 0.1 M aqueous solution of hydrochloric acid was gradually added with stirring into the condensed reaction mixture, so as to form precipitates. The formed precipitates were collected by filtration, washed with water, and dried to obtain the aimed triphenylene derivative. Meanwhile, the compound (2B-1) was synthesized by making the compound (1-1) react with terephthalic acid. Specifically, the compound (1-1) and terephthalic acid were dissolved in toluene, and then the mixture was refluxed and a catalytic amount of concentrated sulfuric acid was added therein to react. After cooled to room temperature, the reaction mixture was subjected to extraction with ethyl acetate. The solvent was distilled off under reduced pressure to obtain the aimed triphenylene derivative (weight average molecular weight: 3000).

Polymers used as the binders were as follows:

P1: polyhydroxystyrene (weight average molecular weight: 12000),

P2: novolac resin (weight average molecular weight: 8500),

P3: polyvinyl alcohol (weight average molecular weight: 22000), and

P4: polyacrylic acid (weight average molecular weight: 11000).

The above triphenylene derivatives and binders were dissolved in various solvents shown in Table 1 in such amounts that the solid contents might be 2 wt %, to prepare each composition for forming a topcoat layer. The obtained compositions were observed by the eye to evaluate the solubility, and thereby graded according to the following criteria:

A: the composition was transparent, and hence the derivative seemed to be dissolved completely;

B: the composition was slightly clouded but almost transparent, and hence the derivative seemed to be dissolved sufficiently;

C: there were some residues in the composition, and hence the derivative was slightly poor in solubility but practically usable; and D: there were many residues in the composition, and hence the composition was practically unusable.

Independently, a substrate was spin-coated with a resist composition in a thickness of 50 nm. The resist composition was AZ DX7260P or AZ AX2110 ([trademark], manufactured by AZ Electronic Materials (Japan) K.K.). After the resist composition was cast on the substrate, each composition for forming a topcoat layer was cast thereon by spin-coating in a thickness of 30 nm. The layered compositions were then heated at 120° C. for 60 seconds to obtain a resist layer covered with a topcoat layer. The formed topcoat layer was observed by the eye and the thickness thereof was measured with a thickness meter to evaluate the coatability of each composition for forming a topcoat layer and thereby to grade them according to the following criteria:

A: the composition was coatable, and the formed topcoat layer was excellent in in-plane evenness of the thickness, B: the composition was coatable, and the formed topcoat layer was slightly poor in in-plane evenness but sufficiently usable in practice, C: the composition was coatable, and the formed topcoat layer was observed by the eye to be poor in surface shape but usable in practice, and D: the composition was uncoatable.

The resist layer thus formed was developed for 30 seconds with a 2.38 wt % tetramethylammonium hydroxide aqueous solution, and then residues left on the surface were evaluated. The results were shown in Table 1.

TABLE 1

| Examples | triphenylene derivative 1-1 | 1-2 | 1-3 | 2B-1 | binder P1 | P2 | P3 | P4 | Solubility solvent | grade | Coatability grade | Residues on surface |
|---|---|---|---|---|---|---|---|---|---|---|---|---|
| Ex. 101 |  | 100 |  |  |  |  |  |  | MIBC | B | C | none |
| Ex. 102 |  |  | 100 |  |  |  |  |  | MIBC | A | B | none |
| Ex. 103 |  |  |  | 100 |  |  |  |  | MIBC | A | A | none |
| Ex. 104 | 100 |  |  |  |  |  |  |  | PGME/H$_2$O = 30/70 | B | B | none |
| Ex. 105 |  | 100 |  |  |  |  |  |  | PGME/H$_2$O = 30/70 | C | C | none |
| Ex. 106 |  |  | 100 |  |  |  |  |  | PGME/H$_2$O = 30/70 | C | C | none |
| Ex. 107 |  |  |  | 100 |  |  |  |  | PGME/H$_2$O = 30/70 | B | B | none |
| Ex. 108 | 100 |  |  |  |  |  |  |  | IPA/H2O = 30/70 | B | C | none |
| Ex. 109 |  |  |  | 100 |  |  |  |  | IPA/H2O = 30/70 | B | C | none |
| Ex. 110 | 50 |  |  |  | 50 |  |  |  | PGME/H$_2$O = 30/70 | B | B | none |
| Ex. 111 | 50 |  |  |  |  | 50 |  |  | PGME/H$_2$O = 30/70 | A | B | none |
| Ex. 112 | 50 |  |  |  |  |  | 50 |  | PGME/H$_2$O = 30/70 | C | C | none |
| Ex. 113 | 50 |  |  |  |  |  |  | 50 | PGME/H$_2$O = 30/70 | C | C | none |
| Ex. 114 |  | 50 |  |  | 50 |  |  |  | PGME/H$_2$O = 30/70 | B | C | none |
| Ex. 115 |  | 50 |  |  |  | 50 |  |  | PGME/H$_2$O = 30/70 | A | B | none |
| Ex. 116 |  |  |  | 50 | 50 |  |  |  | PGME/H$_2$O = 30/70 | A | A | none |
| Ex. 117 |  |  |  | 50 |  | 50 |  |  | PGME/H$_2$O = 30/70 | A | A | none |
| Ex. 118 |  |  |  | 50 |  |  | 50 |  | PGME/H$_2$O = 30/70 | B | B | none |
| Ex. 119 |  |  |  | 50 |  |  |  | 50 | PGME/H$_2$O = 30/70 | B | B | none |
| Ex. 120 | 80 |  |  |  |  | 20 |  |  | PGME/H$_2$O = 30/70 | A | B | none |
| Ex. 121 | 90 |  |  |  |  |  | 10 |  | PGME/H$_2$O = 30/70 | B | B | none |

MIBC: methyl isobutyl carbinol
PGME: propylene glycol monomethyl ether
IPA: isopropanol

COMPARATIVE EXAMPLES 201 TO 203 AND EXAMPLES 201 TO 210

The procedure of Example 101 was repeated except that the composition for forming a topcoat layer was changed into each of the compositions shown in Table 2, to form a resist layer. In the course of exposing each resist layer to extreme UV light, the pressure in the exposure chamber was measured to obtain the pressure difference ΔP between before and after the exposure.

Further, each resist layer was subjected to exposure by use of a BL03 beam from SPring-8 at the illuminance of 0.35 mW/cm$^2$, and then developed for 30 seconds with a 2.38% aqueous solution of tetramethylammonium hydroxide. In that way, the exposure amount necessary for forming a pattern (i.e., the energy threshold) $E_{th}$ was measured. This procedure was repeated except for changing the triphenylene derivative contained in the composition for forming a topcoat layer. The results were shown in Table 2.

TABLE 2

| Examples | triphenylene derivative 1-1 | 1-2 | 1-3 | 2B-1 | binder P1 | P2 | Solvent | ΔP (×10$^{-7}$ Pa) | Eth (mJ/cm$^2$) |
|---|---|---|---|---|---|---|---|---|---|
| Com. 201 | The topcoat layer was not provided. |  |  |  |  |  | — | 17.0 | 5.5 |
| Com. 202 |  |  |  |  | 100 |  | PGME/H$_2$O = 30/70 | 12.0 | 6.5 |
| Com. 203 |  |  |  |  |  | 100 | PGME/H$_2$O = 30/70 | 10.8 | 5.5 |
| Ex. 201 | 100 |  |  |  |  |  | PGME/H$_2$O = 30/70 | 6.52 | 5.5 |
| Ex. 202 |  | 100 |  |  |  |  | MIBC | 6.40 | 5.5 |
| Ex. 203 |  |  | 100 |  |  |  | MIBC | 6.65 | 5.5 |
| Ex. 204 |  |  |  | 100 |  |  | PGME/H$_2$O = 30/70 | 5.07 | 5.5 |
| Ex. 205 | 50 |  |  |  |  | 50 | PGME/H$_2$O = 30/70 | 5.88 | 6.0 |
| Ex. 206 |  | 50 |  |  |  | 50 | PGME/H$_2$O = 30/70 | 5.50 | 6.0 |
| Ex. 207 |  |  | 50 |  | 50 |  | PGME/H$_2$O = 30/70 | 5.21 | 6.0 |
| Ex. 208 |  |  |  | 50 | 50 | 50 | PGME/H$_2$O = 30/70 | 5.17 | 6.0 |
| Ex. 209 | 80 |  |  |  |  | 20 | PGME/H$_2$O = 30/70 | 5.40 | 5.5 |
| Ex. 210 | 90 |  |  |  |  | 10 | PGME/H$_2$O = 30/70 | 5.35 | 5.5 |

COMPARATIVE EXAMPLES 301 To 303 AND EXAMPLES 301 to 310

The composition for forming a topcoat layer was cast by spin-coating to form a layer of 30 nm thickness, and then the light-transmittance of the layer was evaluated. Specifically, the absorption coefficient was estimated by analysis with a spectroscopic ellipsometer, to calculate k values at the wavelengths of 193 nm and 248 nm. As the results shown in Table 5, it was found that the layers of Comparative examples 301 to 303, in which the triphenylene derivatives were not used, so hardly absorbed deep UV light that their k values at 248 nm were very small while those of Examples 301 to 310 largely absorbed deep UV light.

TABLE 3

| | Contents (wt %) | | | | | | | | k value | |
|---|---|---|---|---|---|---|---|---|---|---|
| | triphenylene derivative | | | | binder | | | | | |
| Examples | 1-1 | 1-2 | 1-3 | 2B-1 | P1 | P2 | P5 | Solvent | 193 nm | 248 nm |
| Com. 301 | | | | | 100 | | | PGME/H$_2$O = 30/70 | 0.86 | 0.03 |
| Com. 302 | | | | | | 100 | | PGME/H$_2$O = 30/70 | 1.00 | 0.01 |
| Com. 303 | | | | | | | 100 | PGME/H$_2$O = 30/70 | 0.20 | 0.60 |
| Ex. 301 | 100 | | | | | | | PGME/H$_2$O = 30/70 | 0.60 | 0.85 |
| Ex. 302 | | 100 | | | | | | MIBC | 0.55 | 0.70 |
| Ex. 303 | | | 100 | | | | | MIBC | 0.80 | 0.83 |
| Ex. 304 | | | | 100 | | | | PGME/H$_2$O = 30/70 | 0.80 | 0.85 |
| Ex. 305 | 50 | | | | | 50 | | PGME/H$_2$O = 30/70 | 0.85 | 0.60 |
| Ex. 306 | | 50 | | | | 50 | | PGME/H$_2$O = 30/70 | 0.90 | 0.65 |
| Ex. 307 | | | 50 | | 50 | | | PGME/H$_2$O = 30/70 | 0.82 | 0.58 |
| Ex. 308 | | | | 50 | 50 | 50 | | PGME/H$_2$O = 30/70 | 0.79 | 0.67 |
| Ex. 309 | 80 | | | | | 20 | | PGME/H$_2$O = 30/70 | 0.68 | 0.81 |
| Ex. 310 | 90 | | | | | 10 | | PGME/H$_2$O = 30/70 | 0.59 | 0.83 |

P5: a composition for forming a topcoat layer, containing a polymer comprising methacrylic monomer units having anthracene skeletons and acrylic monomer units (molar ratio: 40/60).

COMPARATIVE EXAMPLE 401 AND EXAMPLES 401 to 411

A substrate was spin-coated with a resist composition in a thickness of 40 nm. The resist composition was SEVR-337 ([trademark], manufactured by Shin-Etsu Chemical Co., Ltd.). After the resist composition was cast on the substrate, each composition for forming a topcoat layer was cast thereon by spin-coating in a thickness of 30 nm. The layered compositions were then heated at 95° C. for 60 seconds to obtain a resist layer covered with a topcoat layer.

The obtained resist layer was subjected to imagewise exposure by use of the SPring-8 New SUBARU storage ring, and then developed for 30 seconds with a 2.38% aqueous solution of tetramethylammonium hydroxide. Subsequently, the exposure amount and the dimension CD of the obtained pattern were measured. Further, the fluctuation of pattern dimension ΔCD in each example was calculated on the basis of the pattern dimension of Comparative example 501, in which the topcoat layer was not provided. The results were shown in Table 4.

TABLE 4

| | Contents (wt %) | | | | | | | Exposure | | |
|---|---|---|---|---|---|---|---|---|---|---|
| | triphenylene derivative | | | | binder | | | amount E$_0$ | CD | ΔCD |
| Examples | 1-1 | 1-2 | 1-3 | 2B-1 | P1 | P2 | P5 | (mJ/cm$^2$) | (nm) | (nm) |
| Com. 401 | The topcoat layer was not provided. | | | | | | | 15.8 | 22.68 | — |
| Com. 402 | | | | | 100 | | | 19.0 | 19.80 | −3.88 |
| Com. 403 | | | | | | | 100 | 18.6 | 18.90 | −4.78 |
| Ex. 402 | 100 | | | | | | | 16.1 | 22.07 | −0.61 |
| Ex. 403 | | 100 | | | | | | 16.5 | 22.15 | −0.53 |
| Ex. 404 | | | 100 | | | | | 16.4 | 22.13 | −0.55 |
| Ex. 405 | | | | 100 | | | | 16.8 | 22.08 | −0.60 |
| Ex. 406 | 50 | | | | | 50 | | 18.3 | 20.37 | −2.31 |
| Ex. 407 | | 50 | | | | 50 | | 18.8 | 20.43 | −2.25 |
| Ex. 408 | | | 50 | | 50 | | | 18.1 | 20.51 | −2.17 |
| Ex. 409 | | | | 50 | 50 | 50 | | 18.5 | 20.30 | −2.38 |

TABLE 4-continued

| | Contents (wt %) | | | | | | | Exposure amount $E_0$ (mJ/cm$^2$) | CD (nm) | ΔCD (nm) |
|---|---|---|---|---|---|---|---|---|---|---|
| | triphenylene derivative | | | | binder | | | | | |
| Examples | 1-1 | 1-2 | 1-3 | 2B-1 | P1 | P2 | P5 | | | |
| Ex. 410 | 80 | | | | | 20 | | 17.6 | 21.60 | −1.08 |
| Ex. 411 | 90 | | | | | 10 | | 17.4 | 22.08 | −0.60 |

Although the exposure amount tended to slightly increase when the topcoat layer was provided, the difference of 1 to 2 mJ/cm$^2$ is practically negligible. In contrast, however, the fluctuation of pattern dimension is an important characteristic of the resist pattern. Specifically, if the absolute value of ΔCD is 2.5 nm or less, the resist pattern can be regarded as highly practical. Further, if it is 1 nm or less, the resist pattern can be said to be excellent.

The invention claimed is:

1. A composition for forming a topcoat layer, containing a solvent and a triphenylene derivative having a hydrophilic group, wherein said triphenylene derivative is a polymer which comprises a repeating unit containing a triphenylene skeleton represented by the following formula (2A) or (2B):

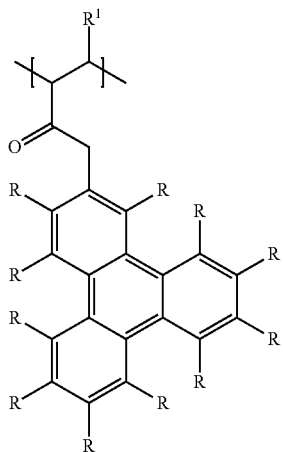

(2A)

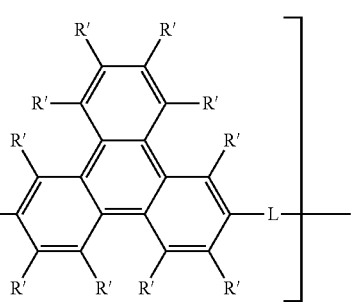

(2B)

in which
each R is hydrogen or a hydrophilic group selected from the group consisting of hydroxyl group, carboxyl group, sulfo group, amino group, amido group, nitro group, cyano group, and polyalkyleneoxide group, provided that at least three of the Rs are the hydrophilic groups;

$R^1$ is hydrogen or methyl group;

each R' is hydrogen, a hydrophilic group selected from the group consisting of hydroxyl group, carboxyl group, sulfo group, aminog group, amido group, nitro group, cyano group, and polyalkyleneoxide group, or a repeating unit represented by the formula (2B), provided that at least three of the R's are the hydrophilic groups; and L is a divalent linking group.

2. The composition according to claim 1 for forming a topcoat layer, wherein said polymer is represented by formula (2B).

3. The composition according to claim 1 for forming a topcoat layer, wherein said polymer is represented by formula (2A).

4. A pattern formation method comprising the steps of:
casting a resist composition on a substrate, to form a resist layer,
coating the resist layer with a composition for forming a topcoat layer,
heating to harden the composition on the resist layer,
subjecting the resist layer to exposure by use of extreme UV light, and
developing the exposed resist layer with an alkali aqueous solution, wherein the composition for forming a topcoat layer contains a solvent and a triphenylene derivative having a hydrophilic group.

5. The pattern formation method according to claim 4, wherein said extreme UV light has a wavelength in the range of 5 to 20 nm.

6. The pattern formation method according to claim 4, wherein the formed topcoat layer has a thickness of 1 to 100 nm.

7. The pattern formation method according to claim 1, wherein said heating step is carried out at a temperature of 25 to 150° C.

8. The pattern formation method according to claim 1, wherein said triphenylene derivative is a polymer which comprises a repeating unit containing a triphenylene skeleton.

9. The pattern formation method according to claim 8, wherein said polymer is represented by the following formula (2B):

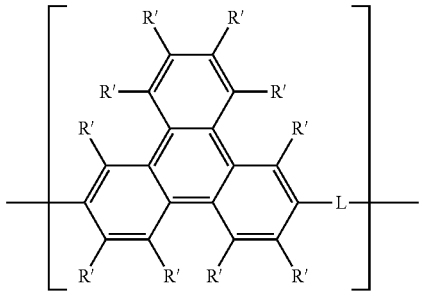
(2B)

in which
each R' is hydrogen, a hydrophilic group selected from the group consisting of hydroxyl group, carboxyl group, sulfo group, amino group, amido group, nitro group, cyano group, and polyalkyleneoxide group, or a repeating unit represented by the formula (2B), provided that at least three of the R's are the hydrophilic groups; and
L is a divalent linking group.

10. The pattern formation method according to claim 8, wherein said polymer is represented by the following formula (2A):

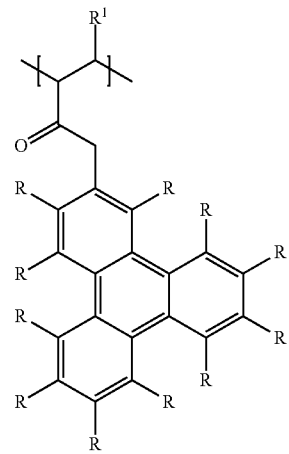
(2A)

in which
each R is hydrogen or a hydrophilic group selected from the group consisting of hydroxyl group, carboxyl group, sulfo group, amino group, amido group, nitro group, cyano group, and polyalkyleneoxide group, provided that at least three of the Rs are the hydrophilic groups; and
$R^1$ is hydrogen or methyl group.

* * * * *